United States Patent
Gobbi

(10) Patent No.: US 9,536,644 B2
(45) Date of Patent: *Jan. 3, 2017

(54) COMPOSITE RESISTORS

(71) Applicant: Analog Devices, Inc., Norwood, MA (US)

(72) Inventor: Ronald R. Gobbi, Derry, NH (US)

(73) Assignee: ANALOG DEVICES, INC., Norwood, MA (US)

( * ) Notice: Subject to any disclaimer, the term of this patent is extended or adjusted under 35 U.S.C. 154(b) by 14 days.

This patent is subject to a terminal disclaimer.

(21) Appl. No.: 14/550,811

(22) Filed: Nov. 21, 2014

(65) Prior Publication Data

US 2015/0077214 A1 Mar. 19, 2015

Related U.S. Application Data

(63) Continuation of application No. 13/831,167, filed on Mar. 14, 2013, now Pat. No. 8,896,408.

(51) Int. Cl.
| | | |
|---|---|---|
| *H01C 7/06* | (2006.01) | |
| *H01C 7/10* | (2006.01) | |
| *H01C 17/232* | (2006.01) | |
| *H01L 49/02* | (2006.01) | |
| *H01L 23/522* | (2006.01) | |
| *H01L 27/08* | (2006.01) | |

(Continued)

(52) U.S. Cl.
CPC .............. *H01C 7/1013* (2013.01); *H01C 7/02* (2013.01); *H01C 7/04* (2013.01); *H01C 7/06* (2013.01); *H01C 17/232* (2013.01); *H01L 23/5228* (2013.01); *H01L 27/0802* (2013.01); *H01L 28/20* (2013.01); *H01L 2924/0002* (2013.01); *Y10T 29/49082* (2015.01)

(58) Field of Classification Search
CPC .. H01L 27/0802; H01L 28/20; H01L 23/5228; H01L 2924/09701; H01C 7/06; H01C 7/006; H01C 17/232; H01C 7/003; H01C 7/02; H01C 7/04; H01C 7/008
USPC ................................................ 338/7, 9, 22 R
See application file for complete search history.

(56) References Cited

U.S. PATENT DOCUMENTS

| | | |
|---|---|---|
| 6,365,480 B1 | 4/2002 | Huppert et al. |
| 6,426,268 B1 | 7/2002 | Huppert et al. |

(Continued)

OTHER PUBLICATIONS

Gregoire, Robert et al., "Process-Independent Resistor Temperature-Coefficients Using Series/Parallel and Parallel/Series Composite Resistors," IEEE International Symposium on Circuits and Systems, May 2007, pp. 2826-2829, IEEE.

(Continued)

*Primary Examiner* — Kyung Lee
(74) *Attorney, Agent, or Firm* — Knobbe, Martens, Olson & Bear LLP

(57) ABSTRACT

A composite resistor includes a thin film resistor element having a first temperature coefficient of resistance and a metal resistor element having a second temperature coefficient of resistance. A portion of the metal resistor element overlaps a portion of the thin film resistor element such that the portion of the metal resistor element is in thermal communication with the portion of the thin film resistor element to compensate for a resistance drift arising during operation of the composite resistor.

20 Claims, 8 Drawing Sheets

(51) Int. Cl.
*H01C 7/02* (2006.01)
*H01C 7/04* (2006.01)

(56) References Cited

U.S. PATENT DOCUMENTS

| | | | | |
|---|---|---|---|---|
| 6,646,539 | B2 * | 11/2003 | Bloch | H01C 7/06 257/E27.016 |
| 6,759,729 | B1 | 7/2004 | Racanelli et al. | |
| 7,704,871 | B2 * | 4/2010 | Beach | H01C 1/14 257/295 |
| 8,188,832 | B2 * | 5/2012 | Das | H01C 7/02 338/7 |
| 8,319,597 | B2 * | 11/2012 | Privitera | H01C 7/06 338/22 R |
| 2006/0145296 | A1 * | 7/2006 | Coolbaugh | H01L 28/20 257/536 |
| 2008/0132056 | A1 | 6/2008 | Beach | |
| 2009/0023263 | A1 | 1/2009 | Phan et al. | |
| 2010/0156588 | A1 | 6/2010 | Privitera | |
| 2014/0266566 | A1 * | 9/2014 | Gobbi | H01C 7/06 338/9 |

OTHER PUBLICATIONS

International Search Report dated Jun. 24, 2014 in corresponding International Patent Application No. PCT/US2014/018707.

Sheet Resistance, http://www.microwaves101.com/encyclopedia/sheet_resistance.cfm, downloaded and printed Mar. 8, 2013.

"Compensating for sense resistor self heating," *Application Note 231* http://www.maximintegrated.com/en/app-notes/index.mvp/id/231, 4 pages, downloaded and printed on Feb. 11, 2015.

"1A batter gas gauge with internal sense resistor and temperature/voltage measurement," *Linear Technology*, LTC2942-1, http://cds.linear.com/docs/en/datasheet/29421f.pdf, 16 pages, downloaded and printed on Feb. 11, 2015.

* cited by examiner

COMPOSITE RESISTORS

REFERENCE TO RELATED APPLICATIONS

This application is a continuation of U.S. patent application Ser. No. 13/831,167, filed Mar. 14, 2013, issued Nov. 25, 2014 as U.S. Pat. No. 8,896,408.

FIELD

Embodiments of the invention relate to electronics, and more particularly, to thin film resistors.

BACKGROUND

Electronic components such as integrated circuit devices include resistors, in particular, thin film resistors formed by patterning thin films of materials, such as semiconductor materials. The temperature of the thin film resistors can increase during operation of the electronic components and can lead to a drift in the resistance value of the thin film resistors. The drift in resistance can be caused by a change in the overall temperature of an integrated circuit chip, such as by overall heat generation from the dissipated energy of the operation of the circuit as a whole, or by self-heating of the thin film resistors themselves. Such drift can lead to performance and reliability degradation of the integrated circuit devices.

SUMMARY

In one embodiment, a composite resistor includes a thin film resistor element having a first temperature coefficient of resistance (TCR) and a metal resistor element having a second TCR of opposite sign to the first TCR, where the metal resistor is electrically connected with the thin film resistor. The composite resistor additionally includes an insulating material interposed between the thin film resistor element and the metal resistor element. The composite resistor assembly further includes an overlapping region comprising a portion of the metal resistor element overlapping a portion of the thin film resistor element such that the portion of the metal resistor element is in thermal communication with the portion of the thin film resistor element through the insulating material.

In another embodiment, a method of compensating a self-heating resistance drift in a composite resistor comprises providing a thin film resistor element having a first temperature coefficient of resistance (TCR) and a metal resistor element having a second TCR in an overlapping region such that a portion of the metal resistor element overlaps with and is in thermal communication with the thin film resistor element. The method further includes electrically connecting the metal resistor element with the thin film resistor element.

In another embodiment, a method of compensating a resistance drift in a composite resistor comprises computing powers dissipated by self-heating of a thin film resistor element having a first temperature coefficient (TCR) and a metal resistor element having a second TCR under an operating condition. The method additionally includes computing temperatures attained by the thin film resistor element and the metal resistor element in part due to the powers dissipated. The method additionally includes computing first and second TCRs at the temperatures of the thin film resistor element and the metal resistor element. The method further includes obtaining a desired net TCR of the composite resistor.

DETAILED DESCRIPTION OF THE PREFERRED EMBODIMENT

Figure 1:
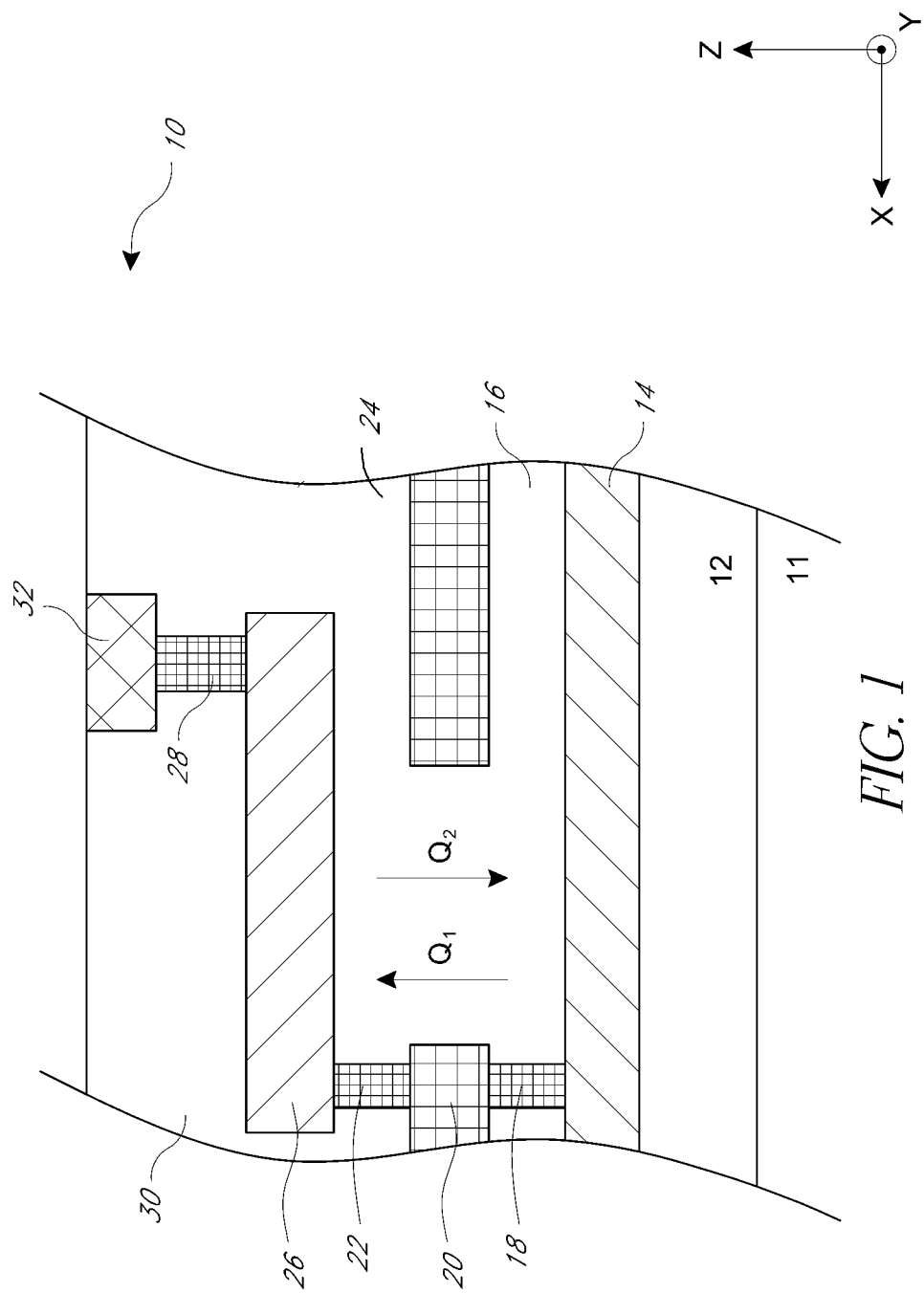
FIG. 1 is a schematic cross-sectional view of an integrated composite resistor according to one embodiment.

Electronic components such as integrated circuit (IC) devices include various resistors. The resistors can be formed in a semiconductor substrate through a diffusion processes, or can be formed on a substrate using patterned metals or various thin films, such as n-doped or p-doped polycrystalline silicon. The temperature of the various resistors can change due to many factors. For example, the temperature of the resistor can change due to a change in the overall temperature of an IC chip, such as by heat generation from the energy dissipated by the IC during operation. In particular, a heat generated by Joule-heating of the resistor itself can also change the temperature of the resistor. Such self-heating can cause a drift in the resistance various resistors of an IC device, leading to performance and reliability degradation of the integrated circuit devices. The change in temperature arising from self-heating can in turn lead to a drift in resistance values of the various resistors.

In particular, the resistance value of a thin film resistor comprising a semiconductor material can increase with increasing temperature, while the resistance value of a metal resistor comprising a metallic material can decrease with temperature. The resistance of a material may be inversely proportional to the number of electronic carriers such as electrons and inversely proportional the mean scattering time between collisions of the electronic carriers. In metals, the number of carriers is relatively constant with changing temperature but the mean scattering time decreases, leading to an increase in resistivity with temperature. In semiconductors, the number of carriers tends to increase exponentially with temperature, dominating the resistivity change and leading to a positive change in resistivity with temperature.

The change in resistance of a resistor can be referred to a drift, and can be characterized by a parameter known as a temperature coefficient of resistance, or TCR. A positive TCR indicates that a resistor's resistance increases with increasing temperature, as in the case of a metallic material.

On the other hand, a negative TCR indicates that a resistor's resistance decreases with increasing temperature, as in the case of a semiconductor material. In general, it is possible to mitigate the effect of drift by electrically combining a plurality of resistors, at least one of which has a positive TCR, and at least one of which has a negative TCR. In such designs, the resistor having a positive TCR is often a metal resistor, and the resistor having a negative TCR is often a thin film resistor, for example a thin film semiconductor resistor. While such mitigation designs can address a drift arising from a temperature change caused by a change in the overall temperature of an IC chip, which results in a relatively small amount of drift, it is often insufficient to address a drift arising from self-heating of the resistor, which results in a higher amount drift due to a local heating effect. This is in part because the local heating tends to affect the local element only, and in part because magnitude of TCR for a metal resistor can be an order of magnitude (or more) smaller than the magnitude of TCR for a semiconductor resistor. Thus, there is a need for compensating for local self-heating effects on resistance.

Various embodiments of composite resistors are disclosed herein. In one embodiment, a composite resistor includes a thin film resistor element having a negative TCR, an insulating film disposed over the thin film resistor element, and a metal resistor element having a positive TCR disposed over the insulating film. In one embodiment, the metal resistor element is connected in series with the thin film resistor element. In another embodiment, a portion of the metal resistor element overlaps a portion of the thin film resistor element with the insulating film interposed between the thin film and metal resistor elements such that the portion of the metal resistor element is in thermal communication with the portion of the thin film resistor element.

In the various embodiments of composite resistors discussed herein, a thin film resistor element can include a semiconductor material, such as silicon. The semiconductor material can be doped n-type or p-type. In one embodiment, the doping concentration can be $1 \times 10^{14}/cm^3$ to $1 \times 10^{16}/cm^3$. In another embodiment, the doping concentration can be $1 \times 10^{16}/cm^3$ to $1 \times 10^{18}/cm^3$. In yet another embodiment, the doping concentration can be greater than $1 \times 10^{19}/cm^3$.

In addition, in the various embodiment of composite resistors discussed herein a metal resistor element can include any suitable metal such as Cu, Al, W, Ni, Pa, Pt, TiN, TaN, WN, AlCu, AlSiCu, etc.

FIG. 1 illustrates a composite resistor according to one embodiment. In the cross sectional view of FIG. 1, a composite resistor 10 includes a substrate 11, a first insulating film 12 disposed on the substrate 11, a thin film resistor element 14 having a negative TCR disposed on the first insulating film 12, a second insulating film 16 disposed on the thin film resistor element 14, and a first level metallization segment 20, where the thin film resistor 14 and the first level metallization segment 20 are electrically connected to each other through a first vertical connector 18. The first vertical connector 18 has a first end contacting the thin film resistor element 14 at a first thin film resistor contact region and a second end contacting the first level metallization segment 20. The composite resistor 10 further includes a third insulating film 24 disposed on the first level metallization segment 20, and a metal resistor element 26 having a positive TCR disposed on the third insulating film 24. In one embodiment, the metal resistor element 26 is formed at a second level metallization level. The first level metallization segment 20 and the metal resistor element 26 are electrically connected to each other through a second vertical connector 22. The second vertical connector 22 has a first end contacting a first level metallization segment 20 and a second end contacting a first contact region of the metal resistor element 26. The composite resistor 10 further includes a fourth insulating film 30 disposed on the metal resistor 26, and a third level metallization 32 disposed on the third insulating film 24. The metal resistor element 26 and the third level metallization 32 are electrically connected to each other through a third vertical connector 28. The third vertical connector 28 has a first end contacting the metal resistor element 26 and a second end contacting the third level metallization 32.

The cross-sectional view of the composite resistor 10 of FIG. 1 further includes an overlapping region that provides thermal communication between the thin film resistor element 14 and the metal resistor element 26. The overlapping region includes a portion of the thin film resistor element 14 and a portion of the metal resistor element 26 which overlaps when viewed in a vertical direction z perpendicular to a surface of the substrate 11, which will be clear from the plan views described below. As illustrated, the overlapping region is bounded in the x-direction by first and second edges of the metal resistor element 26 over the thin film resistor element 14. The overlapping region is bounded in the y direction by first and second edges of the thin film resistor (not shown). The overlapping region includes, in the embodiment of FIG. 1, intervening layers including portions of the second insulating film 16, the first level metallization segment 20, and the third insulating film 24. In other embodiments, some of the intervening layers of FIG. 1 may be omitted, for example the first level metallization segment 20 and/or the third insulating film 24. In other embodiments, additional intervening layers may be present, such as additional insulating films and additional metallization. Moreover, while illustrated as connecting to the third level metallization 32, the skilled artisan will readily appreciate that the composite resistor 10 can instead connect to the second level metallization or lower metallization levels for routing to other devices. Additionally, the vertical positions of the thin film resistor element 14 and the metal resistor element 26 can be reversed such that the metal resistor element 26 is closer to the substrate 11.

The composite resistor 10 of FIG. 1 is configured such that a thermal communication between the overlapping portions of the thin film resistor element 14 and the metal resistor element 26 is sufficient that self-heating of the thin film resistor element 14 causes a resistance drift in the metal resistor element 26. Materials are selected such that self-heating of the thin film resistor element 14 causes resistance drift in one direction, and also causes heating of the metal resistor element 26 that results in resistance drift in the opposite direction. In particular, a first heat $Q_1$ self-generated by the thin film resistor element 14 can be transferred from the thin film resistor element 14 to the metal resistor element 26 and a second heat $Q_2$ self-generated by the metal resistor element 26 can be transferred from the metal resistor element 26 to the thin film resistor element 14 along the vertical z-direction. As a person skilled in the art will understand, heat flux in one-dimension is proportional to $-\kappa(dT/dx)$, where $dT/dx$ is the temperature gradient one dimension in the direction of the heat flow and $\kappa$ is the thermal conductivity of the heat transfer medium. In one embodiment, the first heat $Q_1$ may be substantially higher than the second heat $Q_2$ such that a negative temperature gradient is created between the thin film resistor element 14 and the metal resistor element 26, resulting in a net positive heat flux from the thin film resistor element 14 to the metal resistor element 26. In another embodiment, the second heat $Q_2$ may be substantially higher than the second heat $Q_1$ such that a negative temperature gradient is created between the metal resistor element 26 and the thin film resistor element 14, resulting in a net positive heat flux from the metal resistor element 26 to the thin film resistor element 14. In FIG. 1, the composite resistor 10 is configured such that the thin film resistor element 14 and the metal resistor element 26 have upper surfaces facing the third level metallization 32 that are substantially parallel to an x-y plane and the thermal communication through heat transfer occurs in the z-direction that is substantially orthogonal to the x-y plane.

In some embodiments, the thickness of the metal resistor element 26 is configured so as to maximize an increase in the temperature of the metal resistor, which in turn increases the temperature gradient (dT/dx) between the thin film resistor element 14 and the metal resistor element 26, which in turn increases the heat flux as described above. In one embodiment, the thickness of the metal resistor is between the range of 0.1 µm and 0.6 µm, for instance 0.3 µm. In another embodiment, the thickness of the metal resistor is between the range of 0.6 µm and 1.4 µm, for instance 1.0 µm. In yet another embodiment, the thickness of the metal resistor is between the range of 1.4 µm and 3 µm, for instance 1.6 µm. In addition, in other embodiments, any or all of the above-mentioned thickness ranges can be combined for a wider range of thicknesses.

Figure 2A:
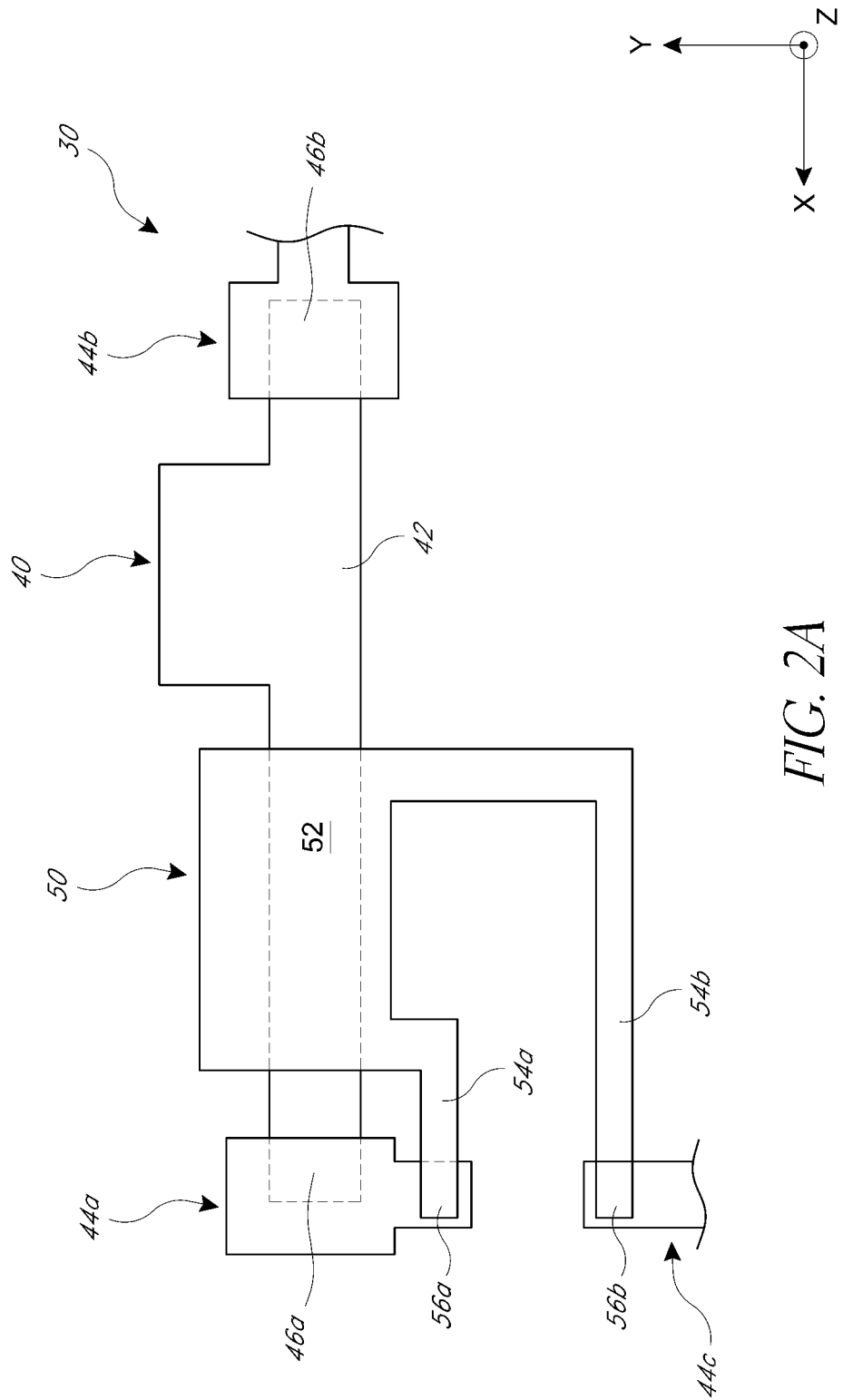
FIG. 2A is a schematic plan view of an integrated composite resistor according to another embodiment.

FIG. 2A shows a plan view of a self-heating compensated composite resistor 30 according to one embodiment. The composite resistor 30 of FIG. 2A can be similar to the composite resistor 10 of FIG. 1, except for placement of certain features and omission of other features, as described below. The composite resistor 30 includes a thin film resistor element 40 having a negative TCR connected in series with a metal resistor element 50.

The electric connection between the thin film resistor element 40 and the metal resistor element 50 can be accomplished in a number of different ways. In the illustrated embodiment, the thin film resistor element 40 is disposed on a first insulating film 12 (not shown), a second insulating film 16 (not shown) disposed on the thin film resistor element 40, and first level metallization segments 44a-44c disposed on the second insulating film 16, where the thin film resistor element 40 and the first level metallization segments 44a-44c are electrically connected to each other through first vertical connectors (not shown). One of the first vertical connectors has a first end contacting the thin film resistor element 40 in a first thin film resistor contact region 46a and a second end contacting the first level metallization segment 44a. Another one of the first vertical connectors has a first end contacting the thin film resistor element 40 and a second end contacting the first level metallization segments 44b in a second thin film resistor contact region 46b. The composite resistor 30 further includes a third insulating film (not shown) disposed on first level metallization segments 46a-46c, and a metal resistor element 50 having a positive TCR disposed on the third insulating film. The first level metallization segments 44a-44c and the metal resistor element 50 are electrically connected to each other through second vertical connectors (not shown). One of the second vertical connectors has a first end contacting the first level metallization segment 44a and a second end contacting the metal resistor element 50 in a first metal resistor contact region 56a through a first metal resistor segment routing 54a. Another one of the second vertical connectors 22 has a first end contacting the first level metallization segment 44c and a second end contacting the metal resistor element 50 in a second metal resistor contact region 56b through a second metal resistor routing segment 54b. The composite resistor 30 can include additional layers similar to those illustrated in FIG. 1 and not shown in FIG. 2A for clarity, including a fourth insulating film disposed on the metal resistor element 50 and higher level(s) of metallization disposed over the fourth third insulating film. Unlike FIG. 1, the metal resistor element 50 of FIG. 2A connects at both ends to a lower metallization level 44a-44c for routing to other integrated devices in the circuit, although claimed subject matter is not so limited.

The plan view of the composite resistor 10 of FIG. 2A further includes an overlapping region 52 that includes an overlapping portion of the thin film resistor element 40 and an overlapping portion of the metal resistor element 50 in the illustrated plan view perpendicular to the substrate surface. The overlapping region 52 is bounded in the y-direction by first and second edges of the thin film resistor element 40 extending in the x-direction and is bounded in the x-direction by first and second edges of the metal resistor element 50 extending in the y-direction. Of course, the resistor elements are not limited to the illustrated shapes and orientations. Similar to the composite resistor 10 of FIG. 1, the overlapping region 52 can include intervening layers that may partially or fully overlap with the thin film resistor element 40 and the metal resistor element 50. For example, the overlapping region 52 can include overlapping portions of insulating film(s). In another example, the overlapping region 52 can include overlapping portions of an intervening metallization segments. A person skilled in the art will understand that inclusion or exclusion of certain intervening insulating films or metallization segments can improve thermal communication between the thin film resistor element 40 and the metal resistor element 50 through various means, including an improvement in an effective thermal conductivity of the intervening volume of material between the thin film resistor element 40 and the metal resistor element 50 and the thermal gradient profile there between, among other means.

In one embodiment, similar to the composite resistor assembly 10 of FIG. 1, the overlapping region 52 of FIG. 2A is configured such that the overlapping portions of the metal resistor element 50 and the thin film resistor element 40 are in thermal communication by exchanging heat with each other. The heat exchange may occur between the overlapping portions through intervening layers which can include the insulating film(s) similar to the second insulating film 16 and/or the third insulating film 24 of FIG. 1.

Figure 2C:
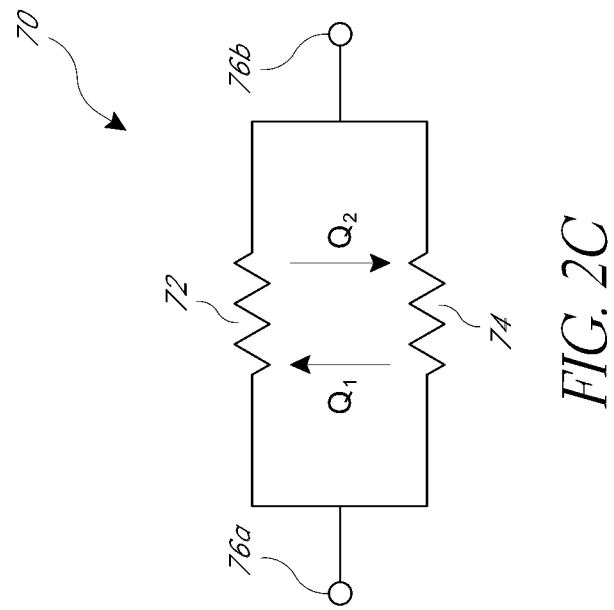
FIG. 2C is a circuit representation of a composite resistor according to another embodiment.
Figure 2B:
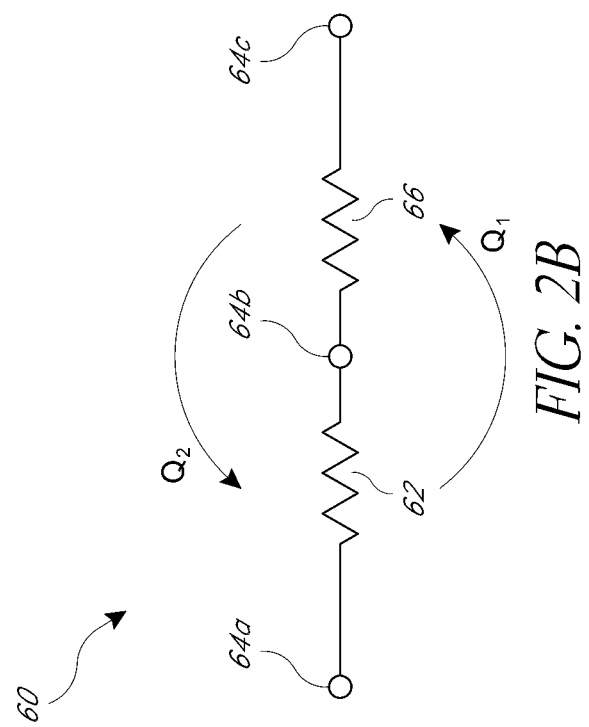
FIG. 2B is a circuit representation of a composite resistor according to one embodiment.

FIG. 2B is a circuit representation of a composite resistor 60 comprising a thin film resistor element 62 and a metal resistor element 66 connected in series according to one embodiment. The thin film resistor element 62 has a first end 64b and a second end 64a and the metal resistor element 66 has a first end 64b and a second end 64c. The first end 64b of the thin film resistor element 62 also serves as the first end 64b of the metal resistor element 66 such that the thin film resistor element 62 and the metal resistor element 66 are electrically in series. It will but understood that, similar to FIG. 2A, the electrical connection between the first ends 64b of the thin film resistor element 62 and the metal resistor element 66 may be made through intervening interconnecting features such as metallization layers and vias. Additionally, the second end 64a of the thin film resistor element 62 and the second end 64c of the metal resistor element 64 can connect, e.g., through interconnecting features such as metallization layers and vias, to other circuit elements (not shown).

As a person skilled in the art will understand, the thin film resistor element 62 and the metal resistor element 66 of the composite resistor 60 having first and second resistances $R_1$ and $R_2$, respectively, are voltage dividers. That is, when a voltage $V_s$ is applied between the second end 64a of the thin film resistor element 62 and the second end 64c of the metal resistor element 66, first and second voltages $V_1$ and $V_2$ proportional to $R_1$ and $R_2$ may drop across the thin film resistor element 62 and the metal resistor element 66, respectively. In addition, the resulting current $I_S=V_S/(R_1+R_2)$ results in self-generated first and second heats $Q_1=I_S^2R_1$ and $Q_2=I_S^2R_2$. As discussed above in connection with FIG. 1, in one embodiment, the first heat $Q_1$ may be substantially higher than the second heat $Q_2$ such that a negative temperature gradient is created between the thin film resistor element 62 and the metal resistor element 66, resulting in a net positive heat flux from the thin film resistor element 62 to the metal resistor element 66. In another embodiment, the second heat $Q_2$ may be substantially higher than the second heat $Q_1$ such that a negative temperature gradient is created between the metal resistor element 66 and the thin film resistor element 62, resulting in a net positive heat flux from the metal resistor element 66 to the thin film resistor element 62.

In one embodiment, one of voltage ratios $V_1/V_2$ and $V_2/V_1$ is in a range between 100,000 and 1. In another embodiment, one of voltage ratios $V_1/V_2$ and $V_2/V_1$ is in a range between 10,000 and 1. In another embodiment, one of voltage ratios $V_1/V_2$ and $V_2/V_1$ is in a range between 1,000 and 1. In another embodiment, one of voltage ratios $V_1/V_2$ and $V_2/V_1$ is in a range between 100 and 1. In another embodiment, one of voltage ratios $V_1/V_2$ and $V_2/V_1$ is in a range between 10 and 1. In another embodiment, one of voltage ratios $V_1/V_2$ and $V_2/V_1$ is in a range between 10 and 2. In yet another embodiment, one of voltage ratios $V_1/V_2$ and $V_2/V_1$ is in a range between 2 and 1. In addition, in other embodiments, any or all of the above-mentioned voltage ratio ranges can be combined for a wider range of voltage ratios.

Correspondingly, in one embodiment, one of the resistance ratios $R_1/R_2$ and $R_2/R_1$ is in a range between 100,000 and 1. In another embodiment, one of resistance ratios $R_1/R_2$ and $R_2/R_1$ is in a range between 10,000 and 1. In another embodiment, one of resistance ratios $R_1/R_2$ and $R_2/R_1$ is in a range between 1,000 and 1. In another embodiment, one of resistance ratios $R_1/R_2$ and $R_2/R_1$ is in a range between 100 and 1. In another embodiment, one of resistance ratios $R_1/R_2$ and $R_2/R_1$ is in a range between 10 and 1. In another embodiment, one of the resistance ratios $R_1/R_2$ and $R_2/R_1$ is in a range between 10 and 2. In yet another embodiment, one of resistance ratios $R_1/R_2$ and $R_2/R_1$ is in a range between 2 and 1. In addition, in other embodiments, any or all of the above-mentioned resistance ratios can be combined for a wider range of resistance ratios.

FIG. 2C is a circuit representation of a composite resistor 70 comprising a thin film resistor element 74 and a metal resistor element 72 connected in parallel according to another embodiment. The thin film resistor element 74 has a first end 76a and a second end 76b and the metal resistor element 72 has a first end 76a and a second end 76b. The first end 76a of the thin film resistor element 74 also serves as the first end 76a of the metal resistor element 72 and the second end 76b of the thin film resistor element 74 also serves as the second end 76b of the metal resistor element 72 such that the thin film resistor element 74 and the metal resistor element 72 are electrically in parallel. As illustrated with respect to the embodiment of FIG. 2A, electrical connections between the resistor elements and other circuit elements may be made through intervening interconnecting features such as metallization layers and vias.

As a person skilled in the art will understand, the thin film resistor element 74 and the metal resistor element 72 connected in series to form the composite resistor 70, having first and second resistances $R_1$ and $R_2$, respectively, are current dividers. That is, when a voltage $V_P$ is applied between the first ends 76a and the second ends 76b, first and second currents $I_1$ and $I_2$ proportional to $V_P/R_1$ and $V_P/R_2$ may flow across the thin film resistor 74 and the metal resistor 72, respectively. In addition, the resulting currents $I_1=V_P/R_1$ and $I_2=V_P/R_2$ result in self-generated first and second heats $Q_1=I_1^2R_1$ and $Q_2=I_2^2R_2$ corresponding to heats dissipated by the thin film resistor element 74 and the metal resistor element 72, respectively. As discussed above in connection with FIG. 1, in one embodiment, the first heat $Q_1$ may be substantially higher than the second heat $Q_2$ such that a negative temperature gradient is created between the thin film resistor element 74 and the metal resistor element 72, resulting in a net positive heat flux from the thin film resistor element 74 to the metal resistor element 72. In another embodiment, the second heat $Q_2$ may be substantially higher than the second heat $Q_1$ such that a negative temperature gradient is created between the metal resistor element 72 and the thin film resistor element 74, resulting in a net positive heat flux from the metal resistor 72 to the thin film resistor element 74.

In one embodiment, one of the current ratios $I_1/I_2$ and $I_2/I_1$ is in a range between 100,000 and 1. In another embodiment, one of current ratios $I_1/I_2$ and $I_2/I_1$ is in a range between 10,000 and 1. In another embodiment, one of current ratios $I_1/I_2$ and $I_2/I_1$ is in a range between 1,000 and 1. In another embodiment, one of current ratios $I_1/I_2$ and $I_2/I_1$ is in a range between 100 and 1. In another embodiment, one of current ratios $I_1/I_2$ and $I_2/I_1$ is in a range between 10 and 1. In another embodiment, one of the current ratios $I_1/I_2$ and $I_2/I_1$ is in a range between 10 and 2. In yet another embodiment, one of current ratios $I_1/I_2$ and $I_2/I_1$ is in a range between 2 and 1. In addition, in other embodiments, any or all of the above-mentioned current ranges can be combined for a wider range of current ranges.

Correspondingly, in one embodiment, one of the resistance ratios $R_1/R_2$ and $R_2/R_1$ is in a range between $1\times10^{-5}$ and 1. In another embodiment, one of resistance ratios $R_1/R_2$ and $R_2/R_1$ is in a range between $1\times10^{-4}$ and 1. In another embodiment, one of resistance ratios $R_1/R_2$ and $R_2/R_1$ is in a range between 0.001 and 1. In another embodiment, one of resistance ratios $R_1/R_2$ and $R_2/R_1$ is in a range between 0.01 and 1. In another embodiment, one of resistance ratios $R_1/R_2$ and $R_2/R_1$ is in a range between 0.1 and 1. In another embodiment, one of the resistance ratios $R_1/R_2$ and $R_2/R_1$ is in a range between 0.1 and 0.5. In yet another embodiment, one of the resistance ratios $R_1/R_2$ and $R_2/R_1$ is in a range between 0.5 and 1. In addition, in other embodiments, any or all of the above-mentioned resistance ratio ranges can be combined for a wider range of resistance ratios.

While FIGS. 2B and 2C illustrate two simple configurations of composite resistors, other embodiments are possible. In one embodiment, a series combination of a first thin film resistor element and a metal resistor element may be in parallel with a second thin film resistor element. In another embodiment, a series combination of a thin film resistor element and a first metal resistor element may be in parallel with a second metal resistor element. In another embodiment, a parallel combination of a first thin film resistor element and a metal resistor element may be in series with a second thin film resistor element. In yet another embodiment, a parallel combination of a thin film resistor element and a first metal resistor element may be in series with a second metal resistor element.

Figure 3A:
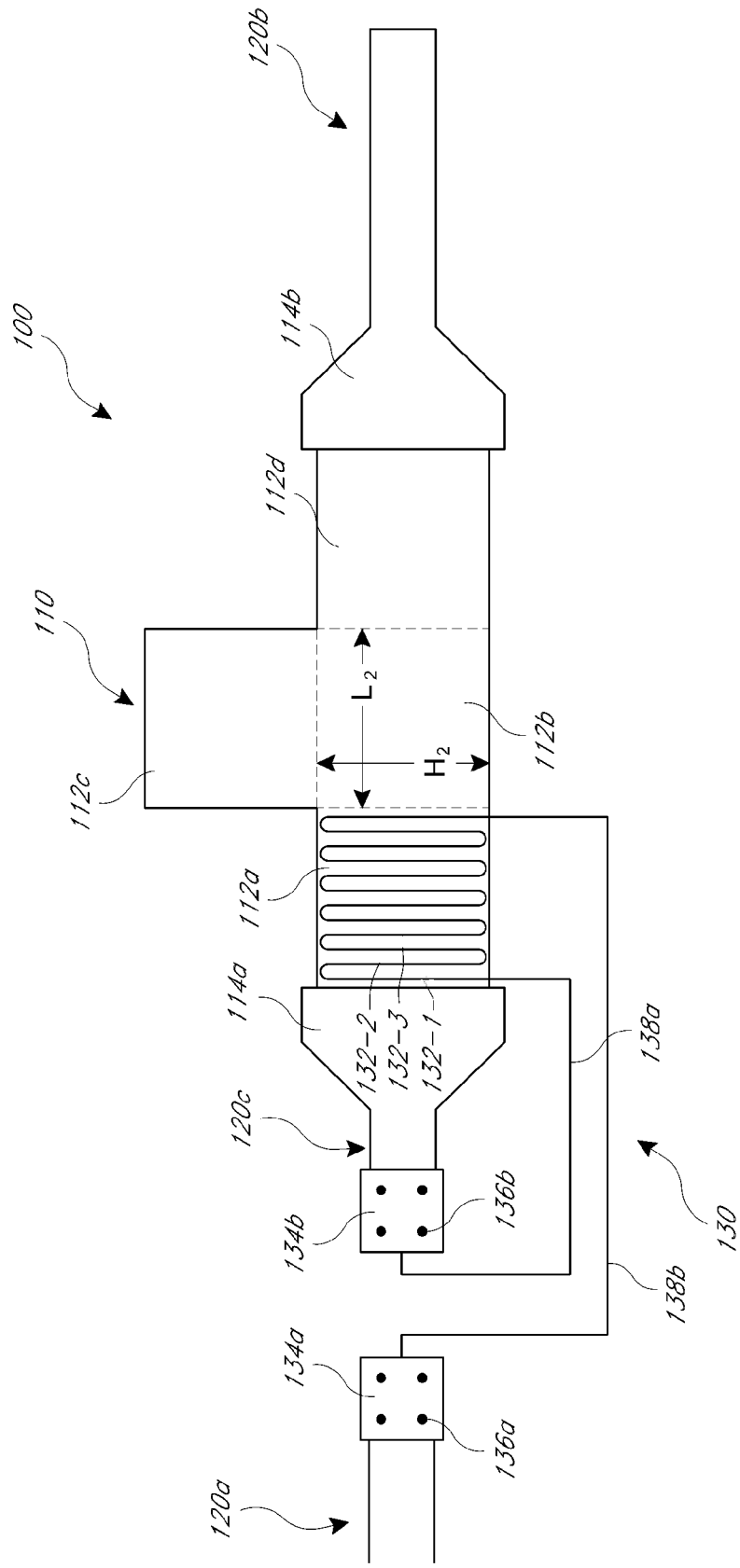
FIG. 3A is a schematic plan view of a composite resistor according to another embodiment.
Figure 3B:
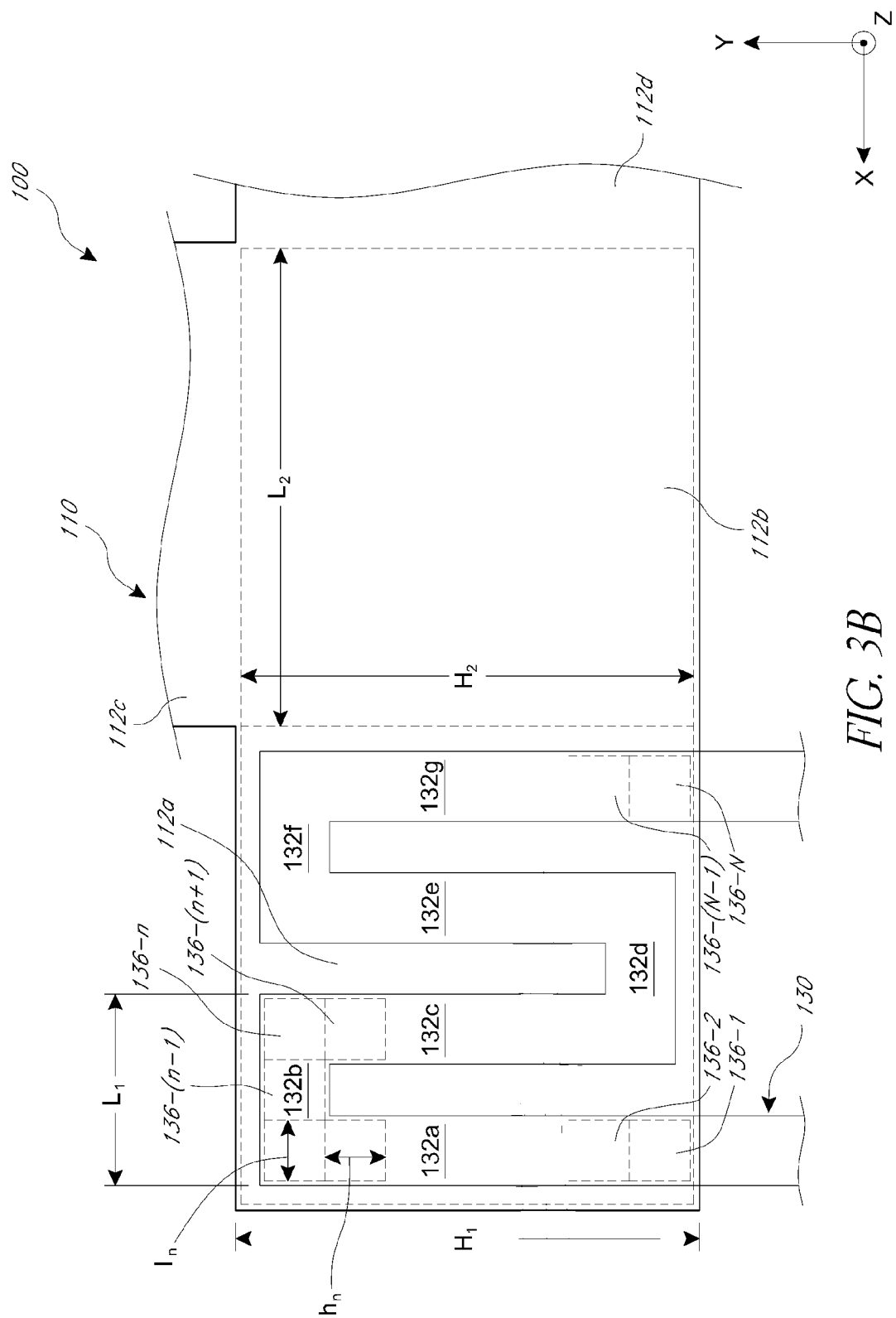
FIG. 3B is an enlarged schematic plan view of a portion of the composite resistor of FIG. 3A.
Figure 3C:
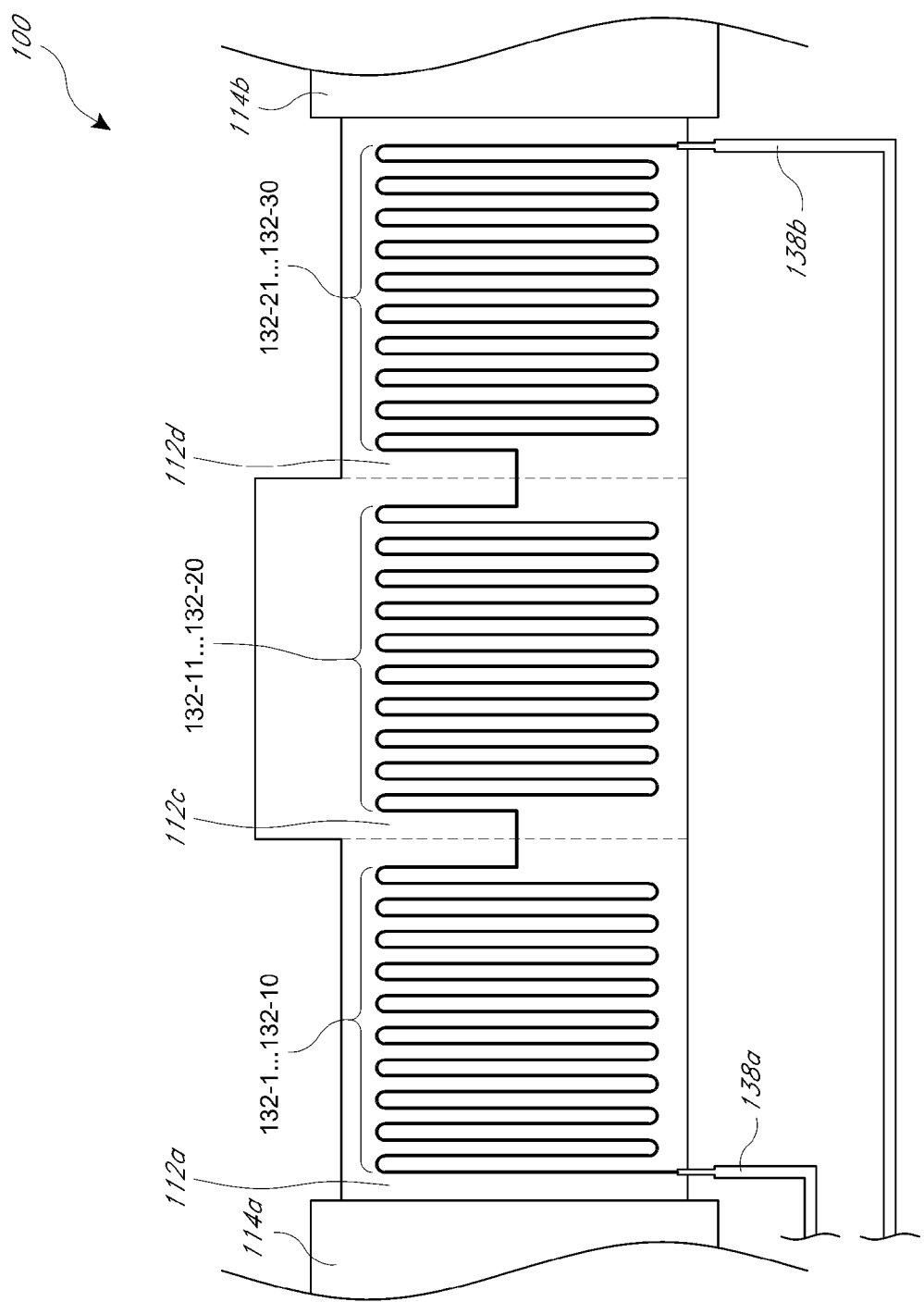
FIG. 3C is a schematic plan view of a composite resistor according to another embodiment.

FIGS. 3A-3C illustrate additional embodiments of composite resistors. Similar to embodiments discussed in connection with FIGS. 1 and 2A-2C, each of the composite resistors of FIGS. 3A-3C includes a thin film resistor element having a negative TCR, a metal resistor element having a positive TCR, and an intervening insulating film(s), wherein the metal resistor element is connected in series with the thin film resistor element. A portion of the metal resistor element overlaps a portion of the thin film resistor element in an overlapping region such that the overlapping portions are in thermal communication with one another. In addition, embodiments of FIGS. 3A-3C further illustrate that the metal resistor element includes an elongated (e.g., serpentine) path in the overlapping region such that the overlapping portion of the metal resistor element has a length greater than a length of the overlapping portion of the thin film resistor element. "Length" in this sense refers to the path traveled by current there through. Furthermore, the elongated path includes bends such that metal resistor element in the overlapping region includes segments in which current flows in different directions. The bends can be within or outside the overlapping region.

FIG. 3A illustrates a composite resistor 100 according to one embodiment. The composite resistor assembly 100 includes a thin film resistor element 110 having a negative TCR. The thin film resistor element 110 can be disposed on a first insulating film (not shown), and a second insulating film (not shown) can be disposed on the thin film resistor 110. Also shown in FIG. 3a are first level metallization segments 120a-120c over and in electrical contact with the thin film resistor element 110 (e.g., through first vertical connectors through the second insulating film). The composite resistor 100 can also include a third insulating film (not shown) disposed on first level metallization segments 120a-c, and a metal resistor element 130 having a positive TCR disposed on the third insulating film. The first level metallization segments 120a-120c and the metal resistor element 130 are electrically connected, such as through the illustrated plurality of vertical connectors 136a and 136b. One of the vertical connectors 136b has a first end contacting the first level metallization segment 120c and a second end contacting the metal resistor element 130 in a first metal resistor contact region 134b through a first metal resistor routing segment 138a. One of the vertical connectors 136a has a first end contacting the first level metallization segment 120a and a second end contacting the metal resistor element 130 in a second metal resistor contact region 134a through a second metal resistor routing segment 138b.

In the example embodiment of FIG. 3A, the composite resistor 100 includes the thin film resistor element 110 and the metal resistor element 130 electrically connected in series to each other by way of the first thin film resistor contact region 114a and the first metal contact region 134b. As discussed above in connection with FIGS. 2B and 2C, the resistor elements can be electrically connected to one another by other means.

The thin film resistor element 110 of the example embodiment in FIG. 3A, while not physically divided, includes a plurality of thin film squares. By way of one example, the thin film resistor element 110 of FIG. 3A includes first through fourth thin film squares 112a-d, wherein each square shares at least one side with an adjacent square, and wherein each square has approximately a length $L_2$ and a width $H_2$. Other embodiments are possible, including any suitable number of squares to obtain a desired resistance of the thin film resistor element 110 and desired thermal communication characteristics with the metal resistor element 130.

The metal resistor element 130 of the example embodiment in FIG. 3A includes a serpentine path including a plurality of segments. In the illustrated embodiment, eleven segments 132-1 through 132-11 are arranged with alternating connecting bends (e.g., U-shaped or squared bends), such that each bend has an opening in an opposite direction compared to an opening of an adjacent bend. Current flows in opposite directions in adjacent segments. Other embodiments are possible, including metal resistors having any suitable number of segments of any suitable dimension and shape and extending in any suitable direction for a desired resistance of the metal resistor element 130 and desired thermal communication characteristics with the thin film resistor element 110.

The composite resistor 100 of FIG. 3A includes an overlapping region including overlapping portions of the thin film resistor element 110 and the metal resistor element 130. In the example embodiment of FIG. 3A, the overlapping portion of the thin film resistor 110 includes an area approximately corresponding to the first thin film square 112a. In this embodiment, the overlapping portion of the metal resistor element 130 includes the serpentine path overlapping the first thin film square 112a. While illustrated as including the bends in the overlapping region, it will be appreciated that the benefits of providing a much longer current path in the overlapping region for the metal resistor element 130 relative to the thin film resistor element 110 can be achieved even in the bends and portions of the segments fall outside the overlapping region.

Similar to the composite resistor 30 of FIG. 2A, the overlapping region of the composite resistor 100 of FIG. 3A can include intervening layers between the thin film resistor element 110 and the metal resistor element 130. For example, the overlapping region can include overlapping portions of the second insulating film (not shown) and/or the third insulating film (not shown). In another example, the overlapping region can include overlapping portions of an intervening metallization segments. A person skilled in the art will understand that inclusion or exclusion of certain intervening insulating films or metallization segments can improve thermal communication between the thin film resistor element 110 and the metal resistor element 130 through various means, including an improvement of in an effective thermal conductivity of the intervening volume of material between the thin film resistor element 110 and the metal resistor element 130 and the thermal gradient profile there between, among other means.

Also similar to the composite resistor 30 of FIG. 2A, the overlapping region in FIG. 3A is configured such that the overlapping portions of the metal resistor element 130 and the thin film resistor element 110 are in thermal communication with each other. Thermal communication, e.g., by thermal conduction, is sufficient that reduction in resistance from self-heating of the thin film element 110 is at least partially compensated by increases in resistance from self-heating of the metal resistor element 130. In some embodiments, the heat exchange may occur through intervening insulating film(s).

The overlapping region illustrated in FIG. 3A, representing about 25% of the area foot print of the thin film resistor element 110, excluding contact regions, is by way of an example only. Other arrangements are possible, including the overlapping region representing less than 25% and up to 100% of the thin film resistor element area, excluding contact regions. In one embodiment, the overlapping region represents between about 80% and 99% of the surface area of the thin film resistor element 110. In another embodiment, the overlapping region represents between about 90% and 95% of the surface area of the thin film resistor element 110.

FIG. 3B illustrates a close-up view of the composite resistor 100 of FIG. 3A. For purposes of illustration, only a subset of the serpentine path of the metal resistor 130 and two full thin film squares 112a and 112b of the thin film resistor are illustrated.

The overlapping region approximately corresponding to an area of the first thin film square 112a is configured such that the overlapping serpentine portion of the metal resistor element 130 and the overlapping square portion of the thin film resistor element 110 are in thermal communication with each other. The illustrated embodiment of FIG. 3B includes a serpentine path of the metal resistor 130 including first through fourth segments 132a, 132c, 132e, 132g. The segments are connected by U-shaped bends such that, in the illustrated embodiment, the overlapping portion of the metal resistor element long segments extending along the y-direction direction and connected to each other by short segments extending along the x-direction. In the illustrated embodiment, long segments 132a and 132c extending in the y-direction are connected by a short segment 132b extending in the x-direction; long segments 132c and 132e extending in the y-direction are connected by a short segment 132d extending in the x-direction; long segments 132e and 132g extending in the y-direction are connected by a short segment 132f extending in the x-direction.

Various embodiments of compensating resistance drift arising from self-heating by use the thin film resistor element 110 and the metal resistor element 130 of the composite resistor 100 through a heat exchange between the two resistors elements is discussed in detail herein.

A person skilled in the art will understand that a change in a resistor's resistance R(T) in response to a changing temperature can be expressed in terms of its temperature coefficient of resistance (TCR), which can be expressed as:

$$R(T) = R_0(T_0) * [1 + TCR_1(T-T_0) + TCR_2(T-T_0)^2], \quad (1)$$

where $T_0$ is a reference temperature, $R_0$ is a reference resistance at the reference temperature, $TCR_1$ is a first order temperature coefficient of resistance, and $TCR_2$ is a second order temperature coefficient of resistance.

A person skilled in the art will also understand that the resistance of a metal (for the metal resistor element 130) may increase with temperature, i.e., the metal has a positive $TCR_M$, whereas the resistance of a semiconductor (for the thin film resistor element 110) may decrease with temperature, i.e., the semiconductor has a negative $TCR_S$. The resistance of a material may be inversely proportional to the number of electronic carriers such as electrons and to the mean scattering time between collisions of the electronic carriers. In metals, the number of carriers is relatively constant with changing temperature but the mean scattering time decreases, leading to an increase in electrical resistivity with increasing temperature. In contrast, in semiconductors, the number of carriers increases exponentially with temperature, dominating the resistivity change and leading to a decrease in electrical resistivity with temperature. Thus, in a composite resistor having a metal resistor and a semiconductor resistor, the net combined TCR may be between the $TCR_M$ and the $TCR_S$, due to a cancellation effect.

For a composite resistor including a metal resistor element having a positive $TCR_M$ in electrical series with a semiconductor resistor element having a negative $TCR_S$, taking just the first order temperature coefficients of resistance of each resistor element, the net temperature coefficient of resistance of the composite resistor $TCR_C$ can be expressed as $$TCR_C = TCR_M \frac{\beta}{1+\beta} + TCR_S \frac{1}{1+\beta}, \quad (2)$$

where $\beta$ is $R_M/R_S$. As equation (2) illustrates, by engineering the first and the second terms on the right side of equation (2) to be approximately equal in magnitude, the composite resistor $TCR_C$ can be minimized.

In one embodiment, $TCR_M$ is about 4000 ppm and TCR is about 50 ppm, such that a TCR ratio of $TCR_M$ to TCR is between about 70 to 90, for instance about 80. Other embodiments are possible. In another embodiment, the TCR ratio is between about 50 to 70, for instance 60. In another embodiment, the TCR ratio is between about 90 to 110, for instance 100.

A person skilled in the art will also understand that resistors elements formed from a thin film material of either a metal or a semiconductor can be designed based on a sheet resistance $R_S$ of the thin film material through the relationship $$R = \rho L/wt = (\rho/t) \times N = R_S \times N \quad (3)$$

where L is the thickness of the thin film material, w is the width of the thin film material, t is the thickness of the thin film material, $\rho$ is the bulk resistivity, N is the number of squares, and $R_S$ is a sheet resistance expressed units of $\Omega$/square. By expressing the resistance this way, $\beta$ of equation (2) can be expressed in simple terms of ratio of the number of squares for each of the component resistor elements.

Thus, a resistance drift arising from self-heating of composite resistors, such as the composite resistors of FIGS. 1, 2A-C, and 3A-3B, can be minimized. First, the flow of heats $Q_1$ from a thin film resistor element to a metal resistor element and $Q_2$ from a metal resistor element to a thin film resistor element as illustrated in connection with FIGS. 1 2A-2C, can be obtained from thermal modeling methods known to a person skilled in the art. Then, based on a first sheet resistance $R_{S1}$ of the thin film resistor element and a second sheet resistance $R_{S2}$ of the metal resistor element, and through equations (1) through (3), a suitable number of thin film squares $N_S$ and a suitable number of metal squares $N_M$ can be determined to minimize the overall change in resistance resulting from the flow of heats $Q_1$ and $Q_2$.

Referring back to FIG. 3B, the metal resistor element 130 includes a suitable number $N_M$ of metal squares and the thin film resistor element 110 includes a suitable number $N_S$ of thin film squares. In the example embodiment of FIGS. 3A and 3B, a person skilled in the art will understand that the total sum of thin film squares $N_S$ is approximately equal to the sum of first, second and third equivalent numbers of thin films squares $N_{S1}$, $N_{S2}$, and $N_{S3}$ corresponding to equivalent numbers of squares formed by the first thin film square 112a, the combination of the second and third thin film squares 112b and 112c, and the fourth thin film square 112d, respectively, in the direction of the current flow. Because current flows in the x-direction, while each of first and fourth thin film squares 112a and 112d account for one equivalent square each, second and third squares combined accounts for one half square. Thus, $N_S$ of this example embodiment of FIG. 3B is about 2.5 squares.

A person skilled in the art will also appreciate that the total sum of thin metal squares $N_M$ is approximately equal to the sum of first through Nth numbers of thin films squares $N_{M1}$ through $N_{MN}$ corresponding to equivalent numbers of squares formed by the first through Nth metal squares 136-1 through 136-N, in the direction of current flow. For simplicity, in FIG. 3B, while there are N squares each represented by dotted lines, only first, second, (n−1)th, nth, (n+1)th, (N−1)th, and Nth squares are shown. In this configuration, each of the first through Nth metal squares 136-1 through 136-N account for one square, except for the metal squares located at corners, such as 136-(n−1) and 136+(n+1), which account for one half square. Thus, in this configuration with six corners, $N_M$ is approximately (N−3).

In FIG. 3C, by way of an example illustration, a self-heating compensated composite resistor assembly 100 having a ratio of $N_M$ of the metal resistor element 130 to $N_S$ of the thin film resistor element 110 of about 500:1. In this example, the overlapping region includes three serpentine overlapping portions of the metal resistor element 130 disposed above three overlapping portions of the thin film resistor element 110 corresponding to the first, second, and fourth thin film squares 112a, 112b, and 112d, respectively. The composite resistor 100 of FIG. 3C is similar to the composite resistor 100 of FIGS. 3A and 3B, except that there are three serpentine overlapping portions of the metal resistor element 130. In addition, a bulk of the third thin film square 112c of the thin film resistor element 110 has been trimmed away, where the current density may not be as uniform as the first, second and fourth thin film squares 112a, 112b, and 112d. In this example, the total sum of thin film squares $N_S$ in the overlapping region is approximately 3, corresponding to the sum of first, second and third equivalent numbers of thin films squares $N_{S1}$, $N_{S2}$, and $N_{S3}$ corresponding to equivalent numbers of squares formed by the first thin film square 112a, the second and third thin film square 112b, and the fourth thin film square 112d, each accounting for about one square. Also in this example, the metal resistor element 130 has first through nineteenth segments 132-1 through 132-19 for the first serpentine portion overlapping the first thin film square 112a, twentieth through thirty-eighth segments 132-20 through 132-38 for the second serpentine portion overlapping the second thin film square 112b, and thirty-ninth through forty-seventh segments 132-39 through 132-47 for the third serpentine portion overlapping the fourth thin film square 112d. By this arrangement, each overlapping portion of the metal resistor has about 19 pairs of equivalent long and short segments and 19 bend (or 38 corners). Each pair of long and short segments account for about 26 squares and each corner account for one half square each, as discussed above for FIG. 3B, such that the total number of squares is about (26×19)+(38/2)=513 squares.

While the resistor assembly 100 of FIG. 3C was illustrated by way of an example as having a ratio of $N_M$ of the metal resistor element 130 to $N_S$ of the thin film resistor element 110 of about 500:1, other embodiments are possible. In another embodiment, the ratio of $N_M$ to $N_S$ can be between about 10:1 to 1000:1. In another embodiment, the ratio of $N_M$ to $N_S$ can be between about 200:1 to 800:1. In another embodiment, the ratio of $N_M$ to $N_S$ can be between about 400:1 to 600:1, for instance about 500:1.

In addition, as illustrated in FIGS. 3A-3C, a ratio of $N_M$ to $N_S$ translates to a length ratio of a metal resistor element length to a thin film resistor element length. As illustrated in FIGS. 3A-3C, the thin resistor 110 has a total length of equal to about $L_2$ multiplied by the number of thin film squares and the metal resistor 130 has a total length equal to about a combined length of a long segment and a short segment multiplied by the number of the long and short segments. For example, in FIG. 3C, the three thin film squares 112a, 112b, and 112d of the thin film resistor 110 have a combined length of about 3×$L_2$, whereas a combined length of 47 long and a short segments of the metal resistor 130 is about 47×$L_2$, to give a length ratio of a metal resistor element length to a thin film resistor element length of about 15. Other embodiments are possible. In another embodiment, the length ratio is between about 1 to 10. In another embodiment, the length ratio is between about 10 to 20. In yet another embodiment, the length ratio is between about 20 to 50.

In various embodiments described above, a person skilled in the art will understand that different configurations have different optimum ratios of a thin film resistor element resistance to the metal resistor element resistance for which a desired degree of compensation is achieved. In one embodiment, a resistance ratio is between the thin film resistor element resistance and the metal resistor element resistance between about 0.4 to 0.8, for instance about 0.6. In another embodiment, the resistance ratio is between about 0.8 to 1.2, for instance about 1.0. In yet another embodiment, the resistance ratio is between about 1.2 to 1.6, for instance about 1.4.

Through various embodiments described above, varying degrees of compensation of a thin film resistor resistance drift can be achieved through a metal resistor element resistance drift. In one embodiment, about 10% to 40% of the thin film resistor element resistance drift can be compensated by the metal resistor element resistance drift. In another embodiment, about 40% to 70% of the thin film resistor element resistance drift can be compensated by the metal resistor element resistance drift. In another embodiment, about 70% to 100% of the thin film resistor element resistance drift can be compensated by the metal resistor element resistance drift. In another embodiment, the thin film resistor element resistance drift can be over-compensated by the metal resistor element resistance by about 1% to 20%. In addition, in other embodiments, any or all of the above-mentioned ranges of percentage of resistance drift compensation can be combined for a wider range of percentage of resistance drift compensation.

Figure 4A:
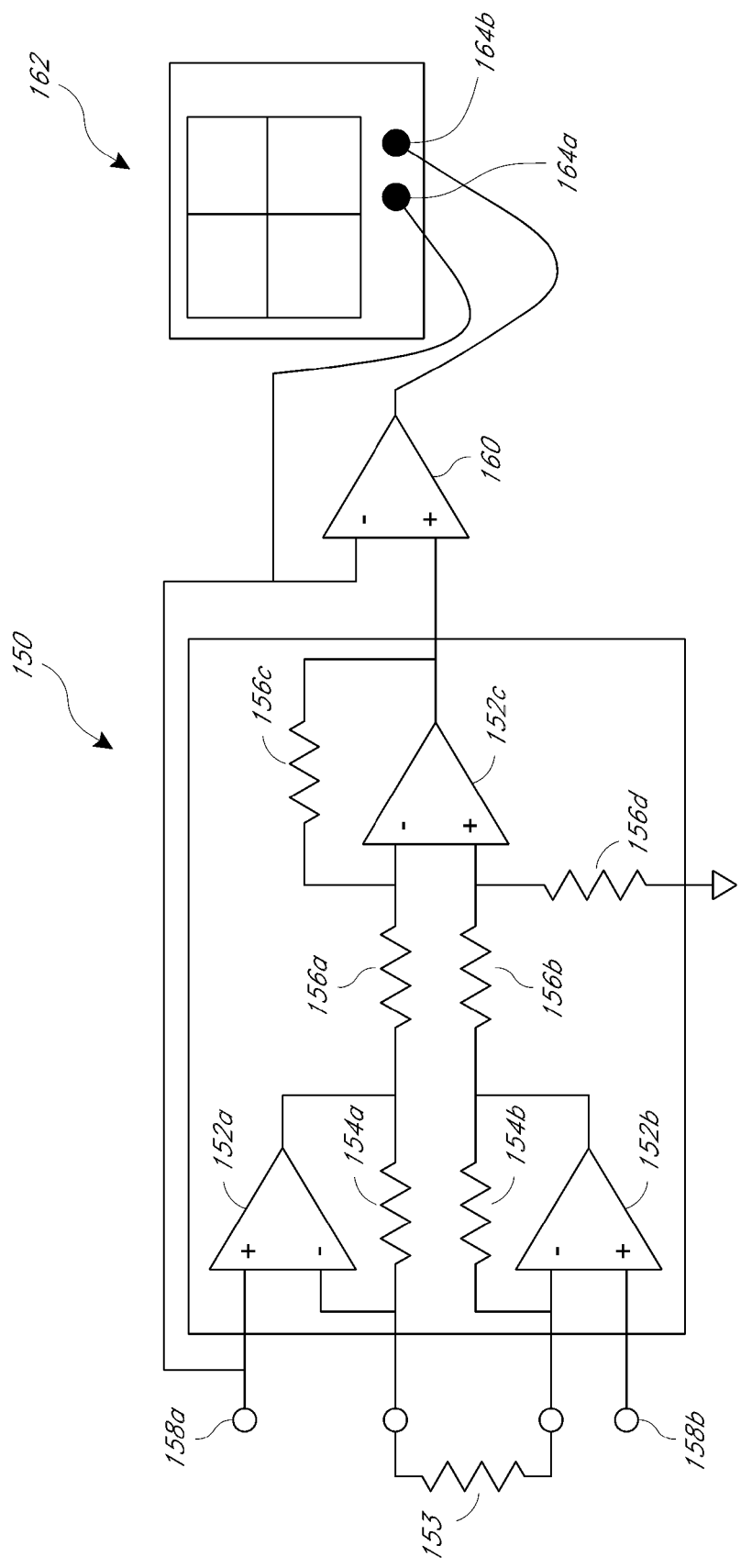
FIG. 4A is circuit diagram of a low noise instrument amplifier including feedback resistors according to one embodiment.

FIG. 4A illustrates a low noise instrument amplifier 150 including first and second feedback resistors 154a and 154b. In this embodiment, each of the first and second feedback resistors 154a and 154b can be a composite resistor as described in FIGS. 1-3. The low noise amplifier 150 can be connected to an external amplifier 160 and further connected to an oscilloscope 162 to measure the linearity of a gain of the low noise instrument amplifier 150. The linearity of the gain of the low noise instrument amplifier 150 can be affected by a thermal drift as described above in connection with FIGS. 1-3C.

The low noise amplifier 150 includes first, second, and third operational amplifiers 152a, 152b, and 153c. Each of the first through third operational amplifiers include a (+) noninverting input terminal, a (−) inverting input terminal, and an output terminal, as will be understood by one of ordinary skill in the art. The output terminals of the first and second operational amplifiers 152a and 152b are connected to a first end and a second end of a gain resistor 153, through first and second feedback resistors 154a and 154b, respectively. The output terminals of the first and second operational amplifiers 152a and 152b are further connected to the inverting input and the noninverting input terminals of the third operational amplifier 153c through first and second resistors 156a and 156b, respectively. The inverting input terminal of the third operational amplifier 152c is connected to a noninverting input terminal of the external amplifier 160 through a third resistor 156c and the inverting input terminal of the third operational amplifier 152c is connected to a ground through a fourth resistor 156d.

In the particular example embodiment of FIG. 4A, each of the first and second feedback resistors 154a and 154b has a value of about 5 KΩ and each of the first through fourth resistors 156a-156d has a value of about 10 KΩ.

The linearity of the gain of the low noise amplifier 150 including first and second feedback resistors 154a and 154b can be measured, for example, by connecting the output terminal of the external amplifier 160 and the inverting input of the external amplifier 160 to an x-axis input 164a and a y-axis input 164b of the oscilloscope 162, respectively, and sweeping a voltage $V_{in}$ across the noninverting inputs 158a and 158b of the first and second operational amplifiers 152a and 152b.

Figure 4B:
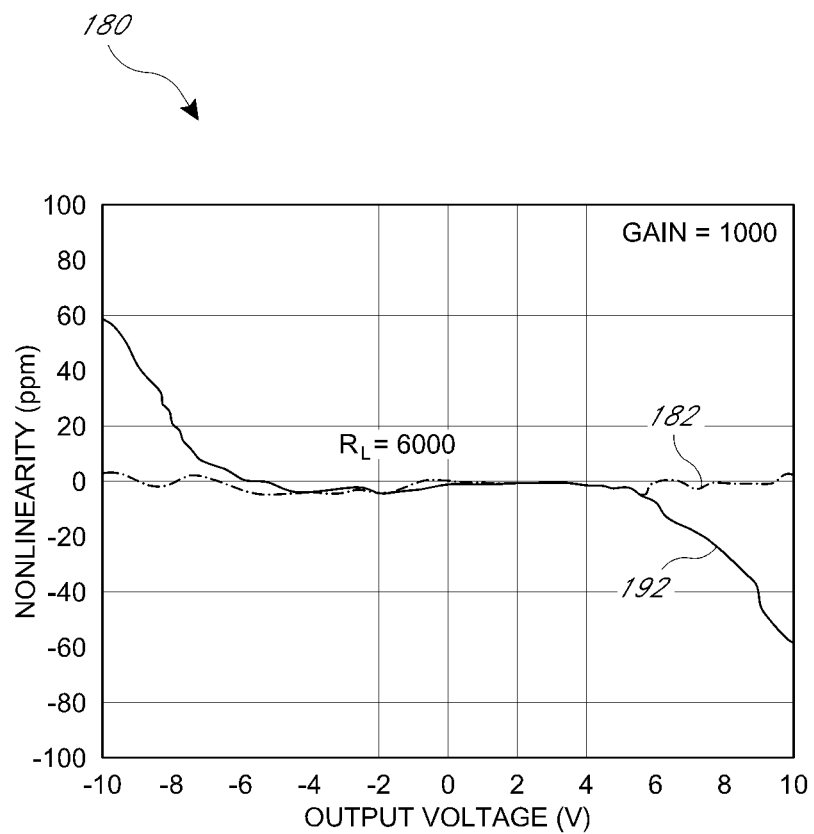
FIG. 4B is a gain nonlinearity graph generated from a low noise instrument amplifier including feedback resistors according to the embodiment of FIG. 4A.

FIG. 4B illustrates a gain nonlinearity plot 180 plotted on a screen of the oscilloscope 162 of FIG. 4A. A gain nonlinearity plot 180 can represent the nonlinearity of the low noise amplifier 150 in FIG. 4A. In the particular embodiment of FIG. 4B, a gain G of the external amplifier 160 is 1000 and the load resistor 153 has a value of 6 KΩ. The first nonlinearity curve 182 corresponds to one embodiment in FIG. 4A where the first and second feedback resistors 154a and 154b are composite resistors, such as the self-heating compensated composite resistors described in FIGS. 1 through 3C. The second nonlinearity curve 192 corresponds to another embodiment in FIG. 4A where the first and second feedback resistors 154a and 154b are ordinary thin film resistors that are uncompensated for self-heating. As can be seen, the first nonlinearity curve 182 corresponding to the low noise amplifier 150 including composite resistors does not deviate from the mean value of about zero for the sweep range of +/−20V of $V_{in}$. In contrast, the second nonlinearity curve 192 corresponding to the low noise amplifier 150 including uncompensated resistors deviates from the mean value of about zero starting at about +/−5V of $V_{in}$. Such deviations from linearity can cause errors in using the low noise amplifier 150.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An electronic device comprising:
    a first resistor having a first temperature coefficient of resistance (TCR);
    a second resistor having a second TCR of opposite sign to the first TCR, the second resistor electrically connected with the first resistor along a first path,
    wherein the first resistor and the second resistor are positioned such that the first resistor is in thermal communication with the second resistor along a second path different from the first path, and such that heating of the first resistor causes a first resistance change in the first resistor and further causes in the second resistor a second resistance change in an opposite direction to the first resistance change.

2. The electronic device of claim 1, wherein the first path comprises an electrical path in which the first and second resistors are electrically connected in series.

3. The electronic device of claim 2, wherein the second path comprises an electrically insulating path.

4. The electronic device of claim 1, further comprising an insulator vertically interposed between the first resistor and the second resistor, wherein the insulator is formed in a horizontally overlapping region between the first resistor and the second resistor through which the heat generated from the self-heating of the first resistor flows.

5. The electronic device of claim 4, wherein the second resistor has a plurality of bends in the overlapping region such that an overlapping portion of the first resistor within the overlapping region is longer than an overlapping portion of the second resistor within the overlapping region.

6. An electronic device comprising:
    a first resistor having a first temperature coefficient of resistance (TCR); and
    a second resistor having a second TCR of opposite sign to the first TCR, the second resistor electrically connected with the first resistor along a first path comprising an electrical path in which the first and second resistors are electrically connected in series,
    wherein the first resistor and the second resistor are positioned such that the first resistor is in thermal communication with the second resistor along a second path different from the first path and comprising an electrically insulating path, and such that self-heating of the first resistor causes a resistance drift in the first resistor at least partially compensated by an opposite resistance drift in the second resistor.

7. The electronic device of claim 6, wherein the first resistor comprises a semiconductor material and the second resistor comprises a metal.

8. The electronic device of claim 6, wherein a ratio of the resistances between the first resistor and the second resistor is between about 0.8 and 1.2.

9. The electronic device of claim 6, wherein the first TCR and the second TCR have an absolute value ratio between about 70 and 90.

10. An electronic device comprising:
    a composite resistor comprising a first resistor configured to undergo a first change in resistance in response to a current passing through the composite resistor and further comprising a second resistor configured to undergo a second change in resistance in an opposite direction to the first change in resistance in response to the current, such that a net change in resistance of the composite resistor in response to the current is lower in magnitude compared to each of the first and second changes in resistance,
    wherein the first resistor and the second resistor are electrically connected and positioned such that self-heating of the first resistor at least partially causes the second change in resistance.

11. The electronic device of claim 10, wherein the first resistor and the second resistor are connected electrically in parallel.

12. The electronic device of claim 11, wherein self-heating of the second resistor at least partially causes the first change in resistance.

13. The electronic device of claim 11, wherein the first resistor is a semiconductor resistor and the second resistor is a metal resistor.

14. The electronic device of claim 10, wherein the first resistor and the second resistor are connected electrically in series.

15. The electronic device of claim 10, wherein the first resistor and the second resistor are interposed by an insulator formed in an overlapping region between the first and second resistor through which the heat generated from the self-heating of the first resistor flows.

16. The electronic device of claim 15, wherein the second resistor has a plurality bends in the overlapping region such that an overlapping portion of the first resistor within the overlapping region is longer than an overlapping portion of the second resistor within the overlapping region.

17. The electronic device of claim 16, wherein the second resistor has a serpentine path in the overlapping region such that the overlapping portion of the second resistor element has a length about 10 to 20 times a length of the overlapping portion of the first resistor.

18. The electronic device of claim 16, wherein the overlapping portion of the first resistor comprises a first number of square portions, the first square portions combined to have a first sheet resistance, and wherein the serpentine path of the second resistor comprises a second number of square portions greater than the first number, the second square portions combined to have a second sheet resistance.

19. The electronic device of claim 18, wherein a ratio of the second number to the first number is between 200 and 800.

20. The electronic device of claim 10, wherein the first change in resistance and the second change in resistance are within about 70% to 100% in magnitude of each another.

* * * * *